United States Patent
Ioannou et al.

(10) Patent No.: US 11,120,882 B2
(45) Date of Patent: Sep. 14, 2021

(54) ERROR RECOVERY OF DATA IN NON-VOLATILE MEMORY DURING READ

(71) Applicant: International Business Machines Corporation, Armonk, NY (US)

(72) Inventors: Nikolas Ioannou, Zurich (CH); Charalampos Pozidis, Thalwil (CH); Sasa Tomic, Kilchberg (CH); Nikolaos Papandreou, Thalwil (CH); Roman A. Pletka, Uster (CH); Aaron D. Fry, Richmond, TX (US); Timothy Fisher, Cypress, TX (US)

(73) Assignee: International Business Machines Corporation, Armonk, NY (US)

( * ) Notice: Subject to any disclaimer, the term of this patent is extended or adjusted under 35 U.S.C. 154(b) by 154 days.

(21) Appl. No.: 16/112,157

(22) Filed: Aug. 24, 2018

(65) Prior Publication Data
US 2020/0066354 A1    Feb. 27, 2020

(51) Int. Cl.
*G11C 16/26* (2006.01)
*G11C 16/34* (2006.01)
*G11C 29/52* (2006.01)
*G06F 11/10* (2006.01)

(52) U.S. Cl.
CPC ......... *G11C 16/26* (2013.01); *G06F 11/1068* (2013.01); *G11C 16/3427* (2013.01); *G11C 29/52* (2013.01)

(58) Field of Classification Search
CPC ..... G11C 16/26; G11C 16/3427; G11C 29/52; G06F 11/1068
See application file for complete search history.

(56) References Cited

U.S. PATENT DOCUMENTS

| | | |
|---|---|---|
| 9,251,909 B1* | 2/2016 | Camp ............... G11C 16/3427 |
| RE46,013 E | 5/2016 | Selinger et al. |
| 9,378,083 B2 | 6/2016 | Ghaly et al. |
| 9,478,315 B2 | 10/2016 | Yang et al. |
| RE46,346 E | 3/2017 | Sommer et al. |
| 2016/0110248 A1 | 4/2016 | Camp et al. |
| 2016/0141048 A1 | 5/2016 | Camp et al. |
| 2017/0133107 A1 | 5/2017 | Ryan et al. |
| 2018/0246782 A1* | 8/2018 | Zeng .................... G11C 29/42 |

* cited by examiner

*Primary Examiner* — April Y Blair
*Assistant Examiner* — Rong Tang
(74) *Attorney, Agent, or Firm* — Scully, Scott, Murphy & Presser, P.C.; Daniel P. Morris

(57) ABSTRACT

A method of optimizing a read threshold voltage shift value for non-volatile memory units organized as memory pages may be provided. An ECC check is performed for active page reads. The method comprises, as part of the read operation, determining a status of the memory page, and reading a memory page with a current threshold voltage shift (TVS) value. Additionally, the method comprises, upon determining that a read memory page command passed an ECC check, returning corrected data read, and upon determining that the read memory page did not pass the ECC check, adjusting the current TVS value based on the status of the memory page to be read. Furthermore, the method comprises, while the read memory pages continues to not pass the ECC check, repeating the adjusting the current TVS value and the determining that the read memory page passes ECC check until a stop condition is met.

19 Claims, 10 Drawing Sheets

ERROR RECOVERY OF DATA IN NON-VOLATILE MEMORY DURING READ

FIELD

The present disclosure relates generally to a method for enhancing a threshold voltage shift value of a non-volatile memory, and more specifically, it relates to an optimization of a read threshold voltage shift value for non-volatile memory units organized as memory pages. The disclosure relates further to a related system for optimizing a read threshold voltage shift value for non-volatile memory units organized as memory pages, and a computer program product.

BACKGROUND

Enterprise storage capacity requirements are growing consistently. At the same time, prices for flash storage units have decreased significantly in comparison to hard disk drive storage systems so that the industry demand for NAND flash-based memory has increased significantly. The cell density of such NAND flash memories is also ever-increasing and the number of bits storable per cell is also increasing—e.g., TLC (triple level cell) or QLC (quad level cell), etc.

In NAND flash memories, cells are typically organized by word-lines and bit-lines into blocks. Currently, a block may have about 10,000,000 cells. The cells can be programmed as single-level cells (SLCs with one bit per cell) or multi-level cells (MLCs, at least two bits per cell). Using an SLC cell, as example, the threshold voltage determines whether a read-back voltage from a NAND cell is a 0 or a 1. If the read-back voltage is below the threshold voltage, it is decided that a logical "0" has been stored in the cell; if the read-back voltage is above the threshold voltage, it is decided that a logical "1" has been stored in the cell. However, if the number of levels in a single cell increases, a more precise threshold voltage determination is required for programming and read-back of data stored in the cells. This finer threshold voltage determination or setting makes MLCs prone to noise.

The raw bit error rate (RBER) of a flash memory block typically increases over time due to additional program and erase (P/E) cycling, charge leakage from retention and, read disturb errors. Typically, a flash memory block may be retired when a page in the block exhibits read errors that cannot be corrected by the error correction code (ECC) that is present at the flash memory controller.

The threshold voltage (VTH) is the voltage above which the cell conducts and depends on the amount of charge stored in the cell. Read threshold voltage shifting is used in block calibration to determine the optimal read threshold voltage shift values. In some prior art, read threshold voltage shift values are also known as threshold voltage shift (TVS) values. Block calibration, is an effective method to reduce the number of read errors and, thus, to prolong endurance and retention for enterprise-level storage systems using NAND flash memories. Block calibration is normally periodically performed as part of an automated low-speed and low-priority background health check process, so as not to adversely impact user read or write operations. The improvement in endurance is achieved by setting the optimal threshold voltage shift (TVS) values at the granularity of groups of pages per block that result in minimizing the maximum raw bit error rate of each flash block.

This background setting of optimal TVS values relies on RBER rates observed during background reads and it stores a determined TVS value in metadata storage for a particular cell group. This basic background approach has been proven to work well in lateral (2-D) NAND flash memory devices. However, the recent proliferation of 3D NAND flash memory devices has introduced new distortion mechanisms that affect the RBER of flash memory pages and blocks in different ways than before. Notably, 3D flash memory exhibits an abrupt change in optimal voltage thresholds when switching from a P/E cycling phase to a retention phase, or due to read disturb effects. The change in VTH is monotonically increasing with a number of P/E cycles—i.e., before retention or read disturb—that the block has seen, and is much more pronounced than in 2D flash memories.

As a result of the abrupt VTH change in 3D flash memories, the threshold-voltage shifting algorithms, known in the art, are not adequate any longer.

SUMMARY

According to one aspect of the present invention, a method for optimizing a read threshold voltage shift value for non-volatile memory units, organized as memory pages, may be provided. Each memory page may comprise a plurality of memory cells. The read process may happen in the presence of an error correction code method. The provided method may comprise, as part of a read operation, determining a status of the memory page to be read, and reading a page of memory cells with a current threshold voltage shift value.

The method may also comprise, upon determining that a read memory page command passed an error correction code check, returning corrected data read from the memory page as output of the read operation, and upon determining that the read memory page did not pass the error correction code check, adjusting the current threshold voltage shift value based on the status of the memory page to be read.

Furthermore the method may comprise a loop process, namely: while the read memory the pages continue to not pass the error correction code check, repeating the adjusting of the current threshold voltage shift value and the determining that the read memory page passes that the error correction code check—which implicitly also comprises a determination that the read memory page did not pass the ECC check—until a stop condition is met.

According to another aspect of the present invention, a related system for optimizing a read threshold voltage shift value for non-volatile memory units organized as memory pages may be provided.

(20) Furthermore, embodiments may take the form of a related computer program product, accessible from a computer-usable or computer-readable medium providing program code for use, by, or in connection, with a computer or any instruction execution system. For the purpose of this description, a computer-usable or computer-readable medium may be any apparatus that may contain means for storing, communicating, propagating or transporting the program for use, by, or in connection, with the instruction execution system, apparatus, or device.

BRIEF DESCRIPTION OF THE SEVERAL VIEWS OF THE DRAWINGS

It should be noted that embodiments of the invention are described with reference to different subject-matters. In particular, some embodiments are described with reference to method type claims, whereas other embodiments are described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be disclosed within this document.

The aspects defined above, and further aspects of the present invention, are apparent from the examples of embodiments to be described hereinafter and are explained with reference to the examples of embodiments, but to which the invention is not limited.

Figure 1:
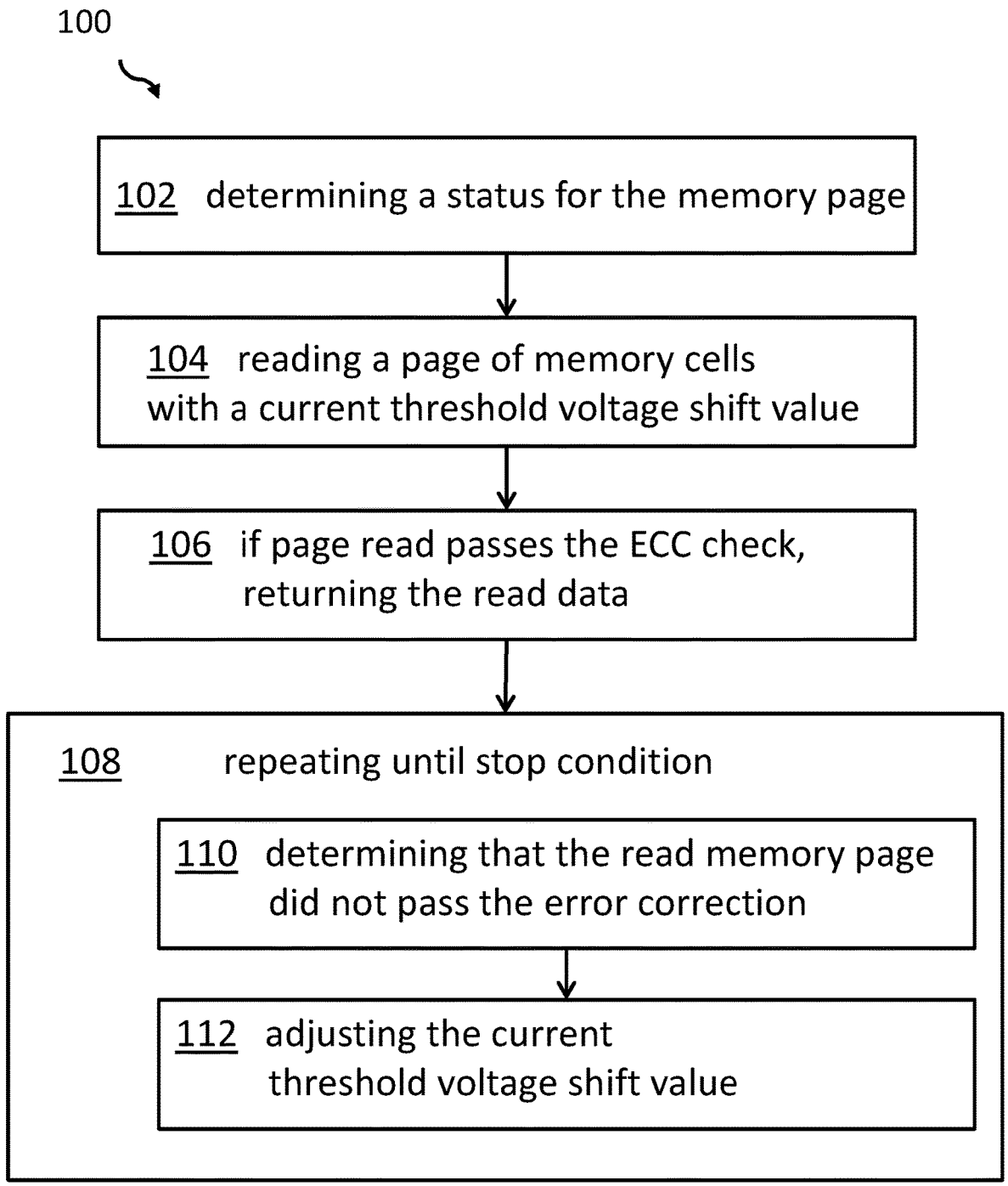

Embodiments of the invention will be described, by way of example only, and with reference to the following drawings:

FIG. 1 shows a block diagram of an embodiment of the inventive method for optimizing a read threshold voltage shift value for non-volatile memory units organized as memory pages.

Figure 2:
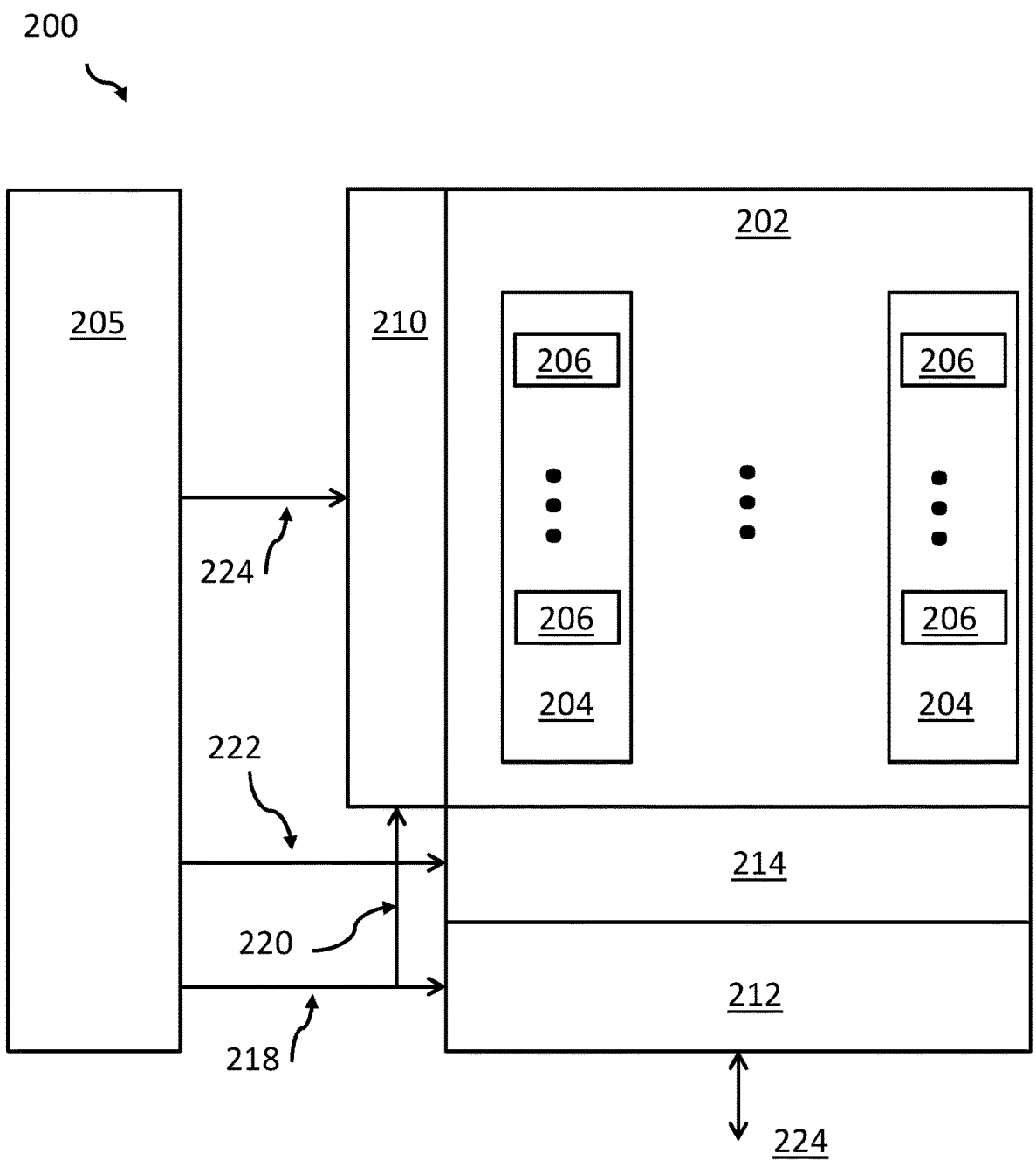

FIG. 2 shows a block diagram of an exemplary flash memory module that can be utilized to implement the proposed concept.

Figure 3:
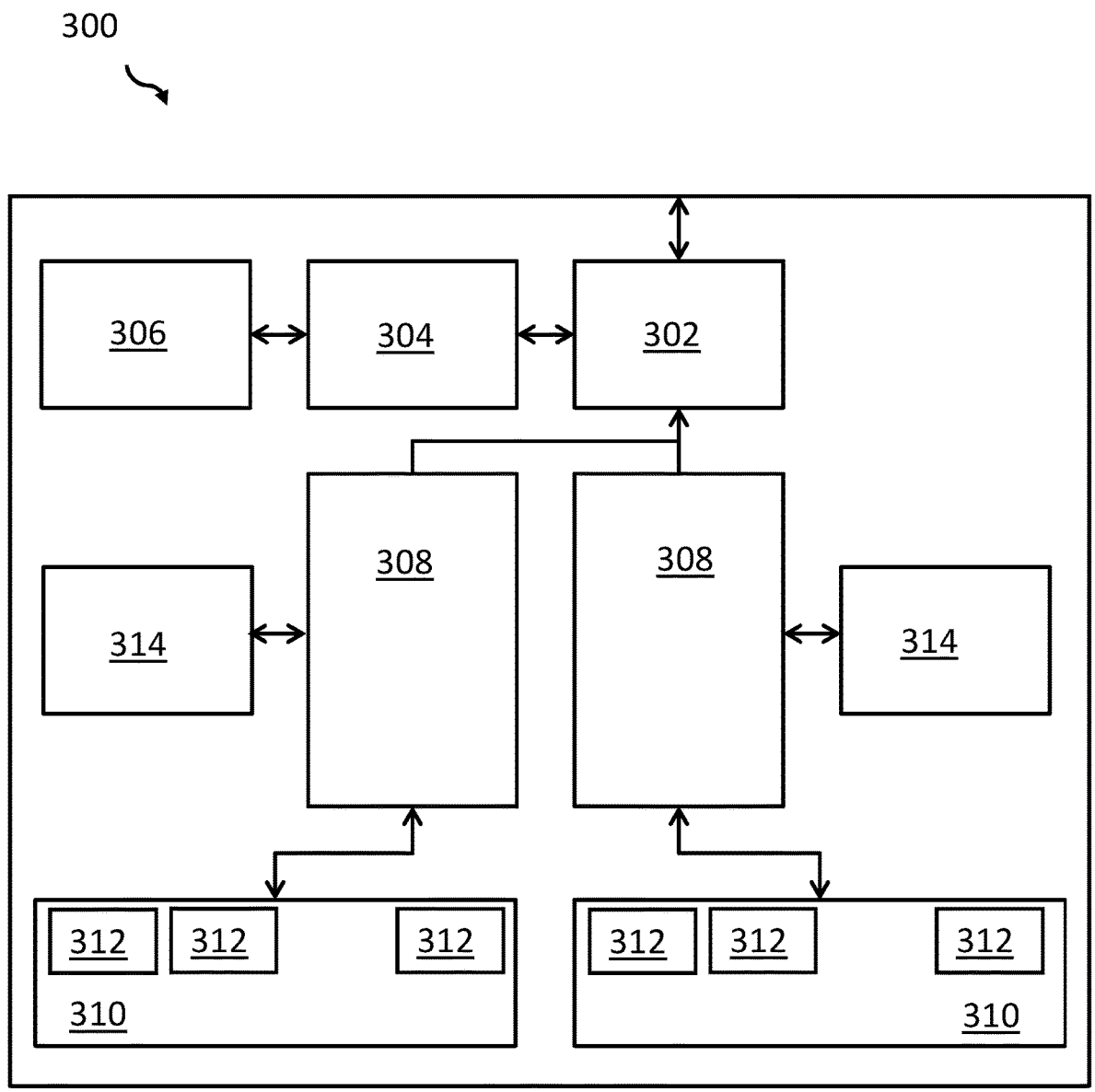

FIG. 3 shows a block diagram of a flash card used in a data storage system.

Figure 4:
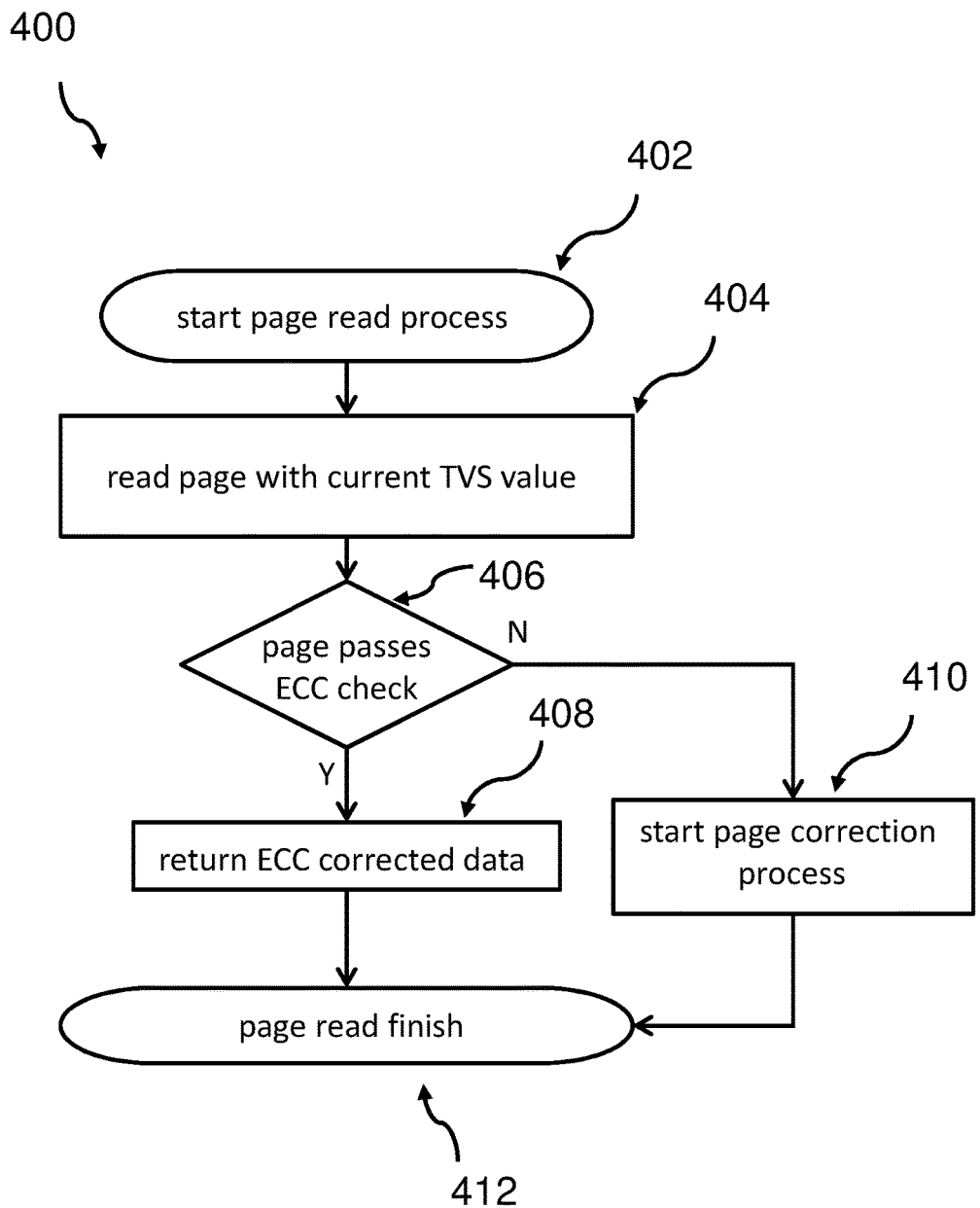

FIG. 4 shows an embodiment of a high-level flow chart of a page read process.

Figure 5A:
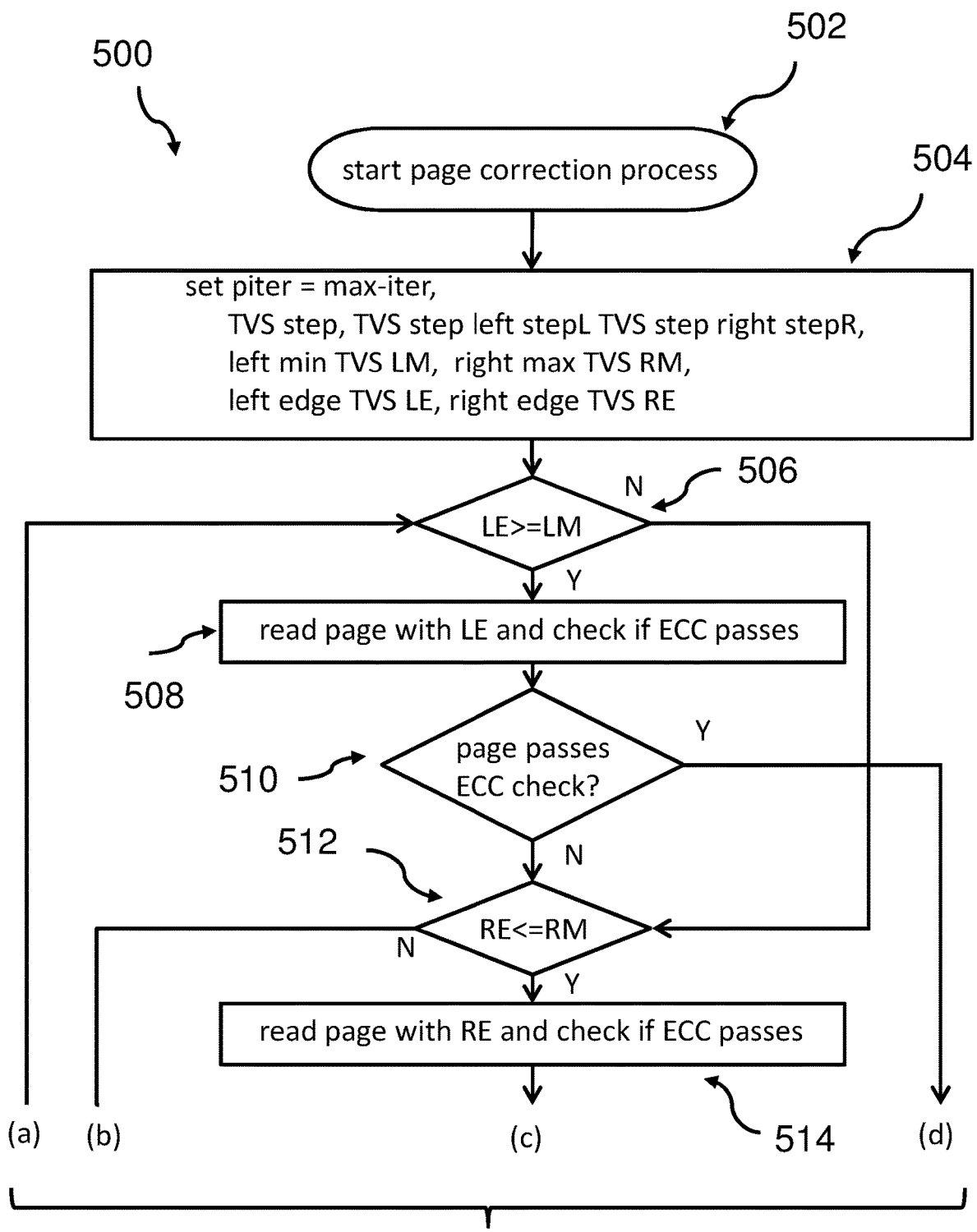

FIG. 5a shows a first portion of a more detailed flow chart of a page correction process.

Figure 5B:
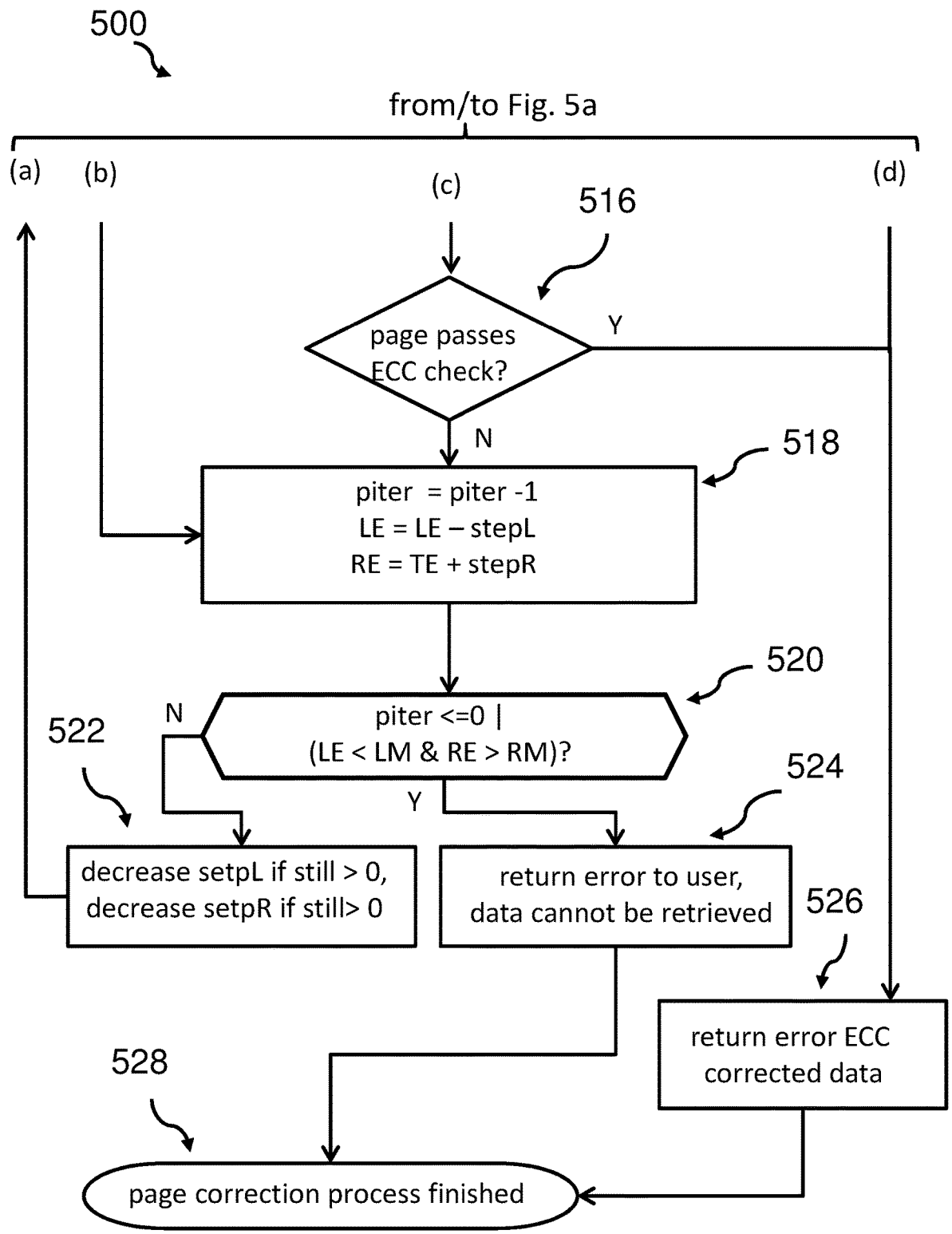

FIG. 5b shows the second portion of a more detailed flow chart of the page correction process.

Figure 6A:
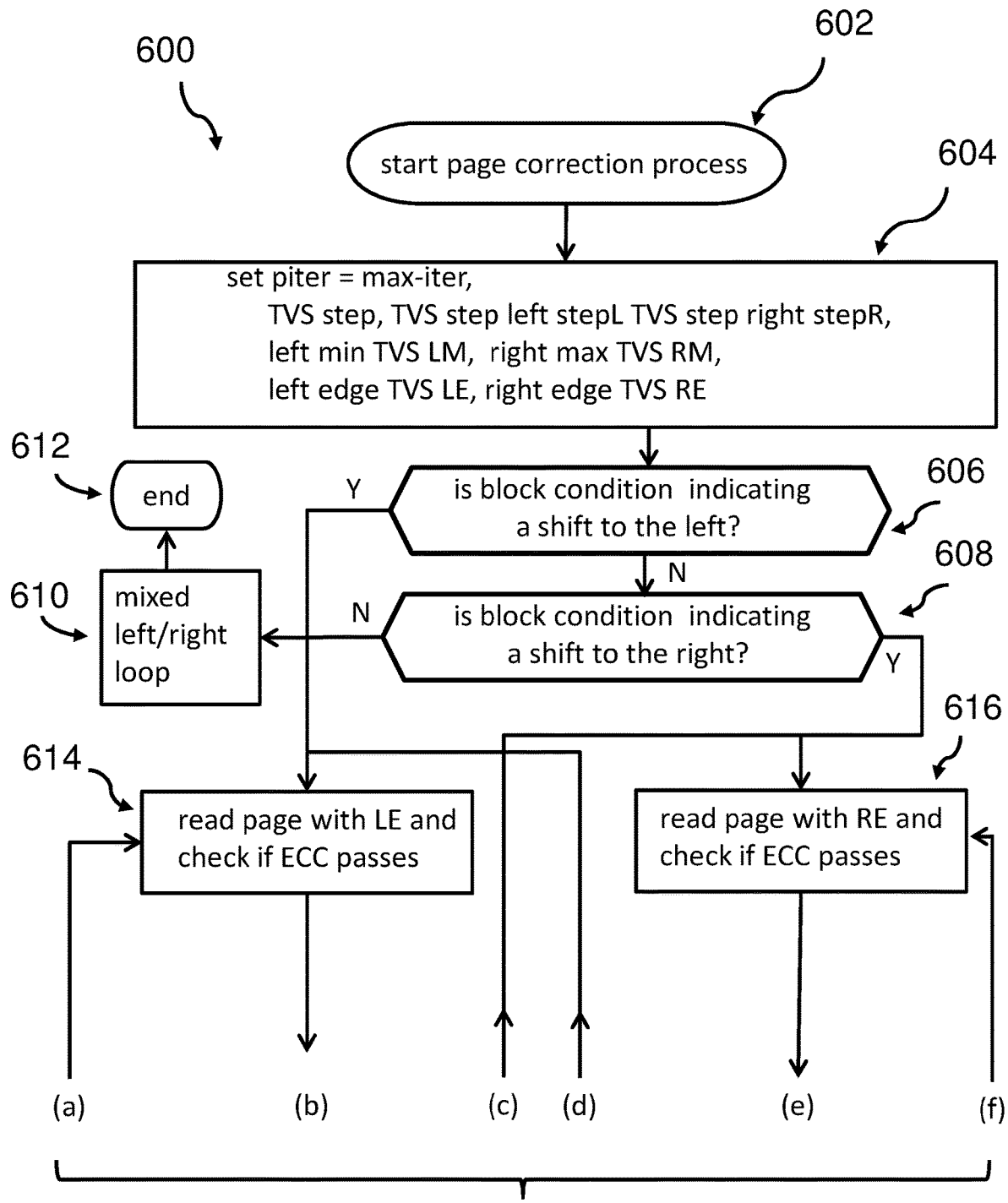

FIG. 6a shows a first portion of an alternative implementation of a more detailed flow chart of the page correction process.

Figure 6B:
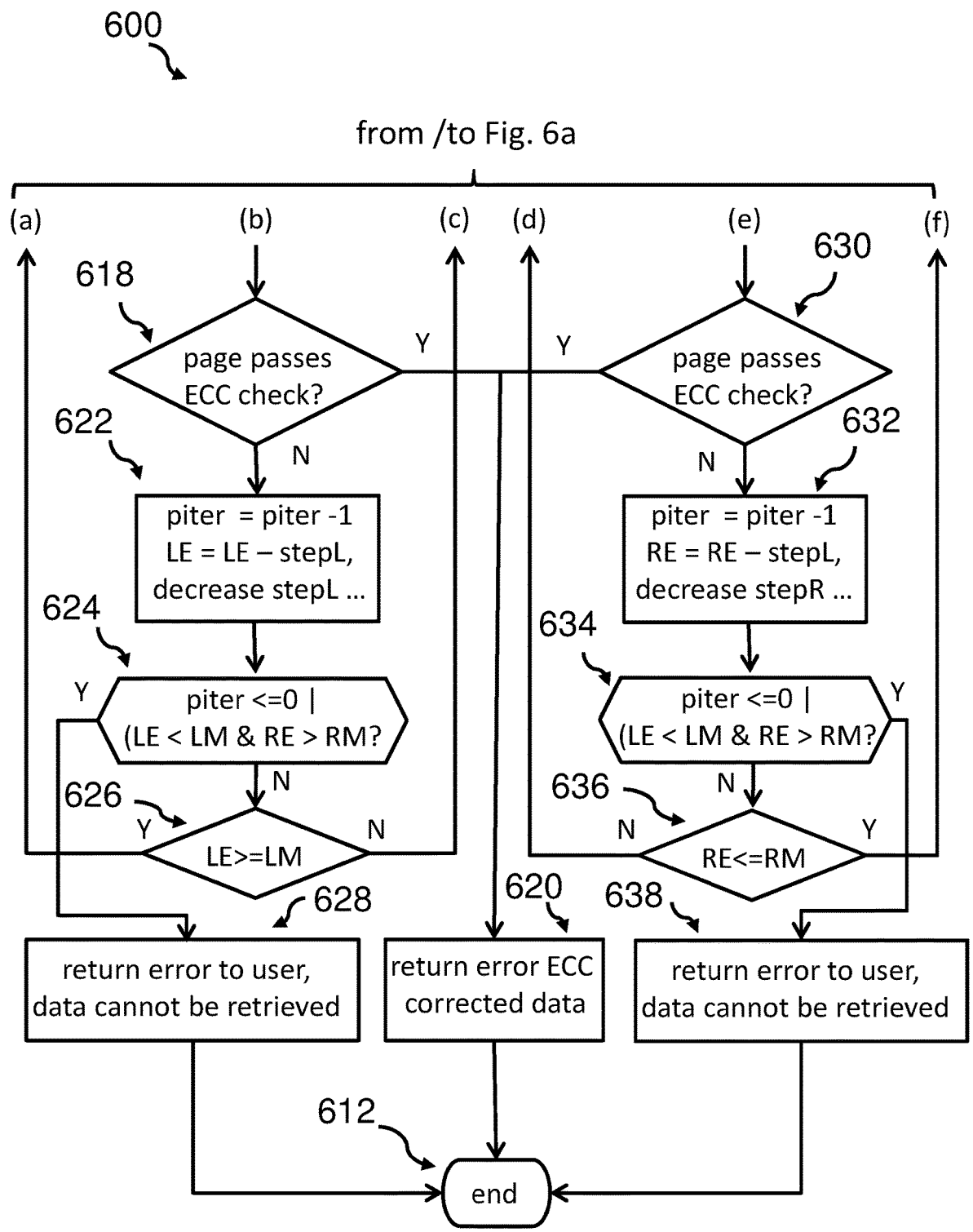

FIG. 6b shows the second portion of the alternative implementation of a more detailed flow chart of the page correction process.

Figure 7:
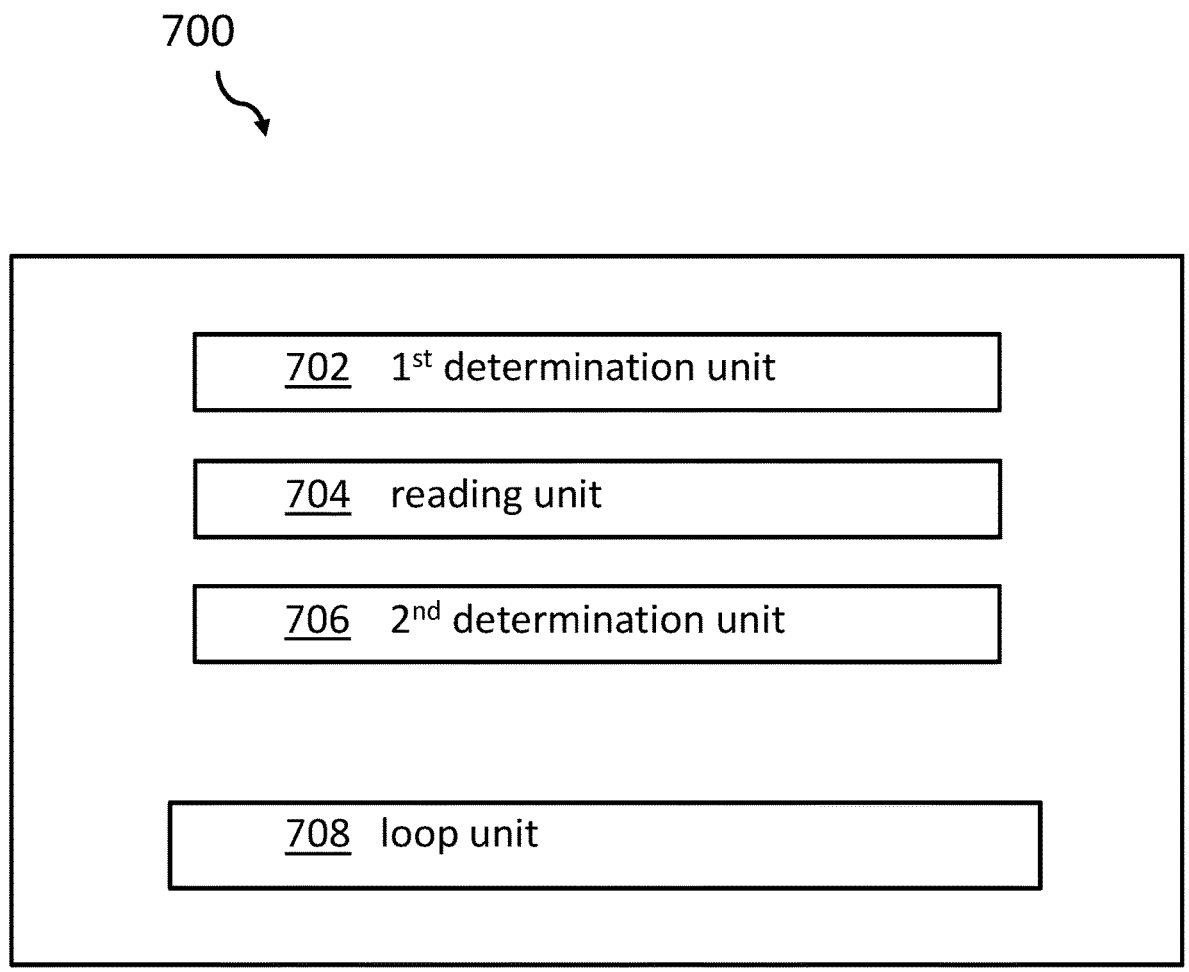

FIG. 7 shows a block diagram of an embodiment of the inventive system for optimizing a read threshold voltage shift value for non-volatile memory units organized as memory pages.

Figure 8:
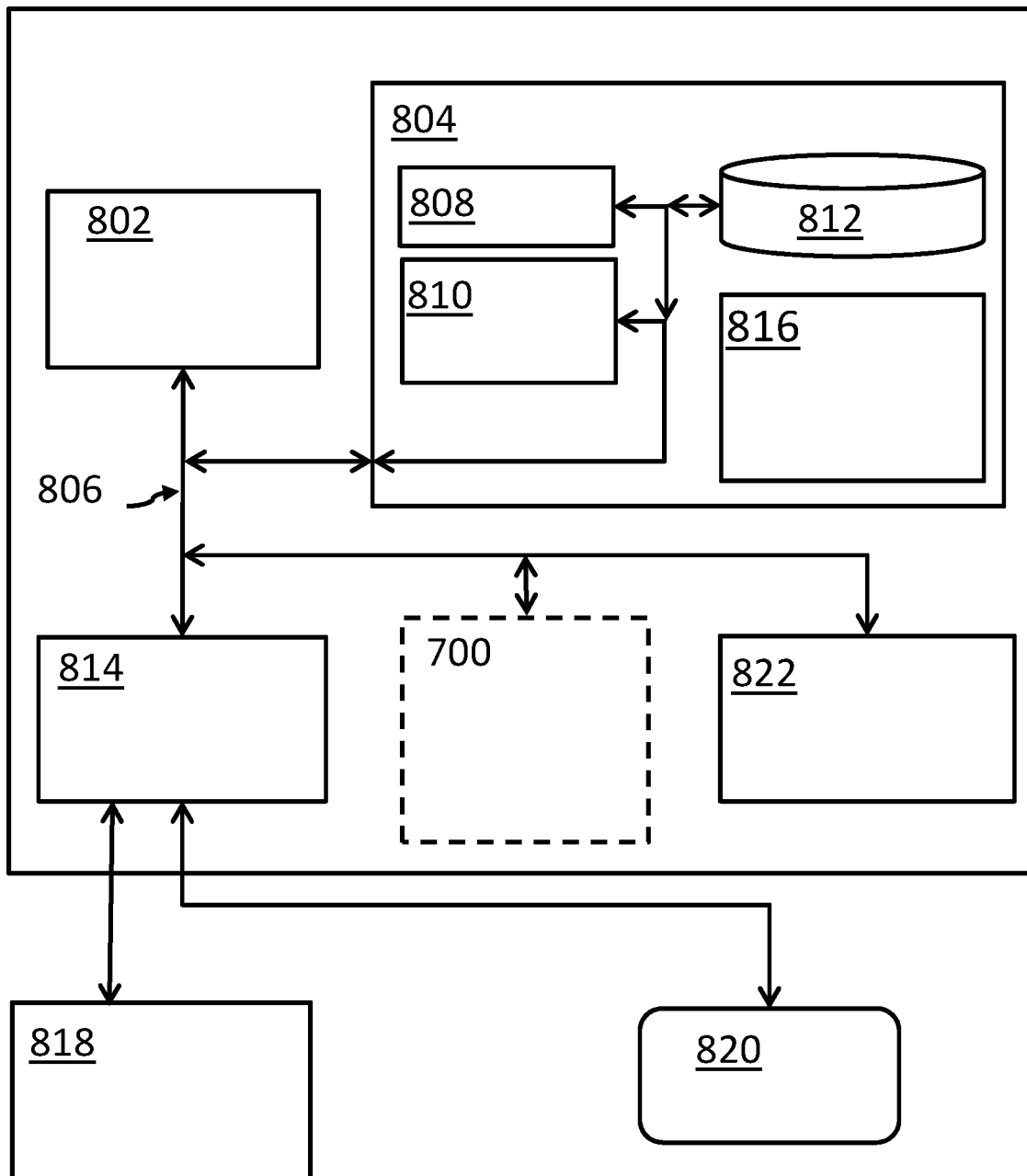

FIG. 8 shows an embodiment of a computing system comprising the system according to FIG. 7.

DETAILED DESCRIPTION

In the context of this description, the following conventions, terms and/or expressions may be used:

The term 'read threshold voltage shift value' may denote here a voltage value by which logical statuses—here, i.e., "0" and "1"—may be read out of a 3D NAND flash memory cell. Threshold voltage (VTH) is the voltage above which the cell conducts. It depends on the amount of charge stored in the cell. Read voltage shifting is used in block calibration to determine the optimal read threshold voltage shift values. It may represent an effective method to reduce the number of read errors in the memory cells and, thus, to prolong endurance and retention for enterprise-level storage systems using NAND flash memories. The process of block calibration is normally performed as part of an automated background health check process, so as not to adversely impact user read or write operations. The background health check process may not be part of the normal operation—i.e., read and/or write of active data bits to memory cells—but may be performed outside the active usage of the memory cells during maintenance phases for the memory system.

The term 'new current threshold voltage shift value' may denote a newly determined TVS in order for a proper read-out of bits of cells in a 3D NAND flash memory system. This value may be used for current and future read-outs of memory cells or, may be adjusted again.

The term 'error correcting code' (ECC) may denote an algorithm that encodes data by adding redundant information in such a way that data can be reliably transmitted over an unreliable channel. ECCs are characterized by the number of errors they can correct (t_c) as well as the number of errors they are capable to detect (t_d), where t_c<=t_d. If there happen to be more errors in a data block than can be detected, then there is a higher risk of miscorrection. The probability that more errors occur than can be detected can be reduced by choosing the parameters of the ECC accordingly. ECC algorithms consist of two parts. The first part is the ECC encoder which is executed upon a write operation of data to create a codeword that is a representation of the original data including some extra information that will allow to detect and correct errors occurred. The second part is the ECC decoder which receives an encoded codeword upon a read operation and calculates therefrom a value that tells whether the encoded codeword comprises one or more errors. After this calculation, the ECC decoder may try to decode the codeword. The result of the decoding of an erratic codeword can be: (i) the correct codeword being decoded, (ii) a decoding failure event called an erasure, e.g., the codeword could not be corrected, or (iii) a miscorrection resulting in an incorrect codeword. An ECC for a certain application is designed to reduce the probability of miscorrections to an acceptable level. Therein it is better to detect an erasure than to make a miscorrection. Typical ECC algorithms that can be used in non volatile memories are Reed Solomon (RS), Bose-Chaudhuri-Hocquenghem (BCH), or Low-density Parity Codes (LDPC).

The term 'read operation' may denote here an active read process relating to a calling process for retrieving stored data from memory cells. In contrast to this may be a background read operation performed for maintenance purposes of non-volatile memory cells/systems. Such background read operations may be performed in order to optimize read threshold voltage levels for non-volatile memory cells. In contrast to that, the read operation of the here proposed concept is an active, online or foreground read operation as part of a user and/or system call with the purpose of actively retrieving data.

The term 'foreground operation' may denote an operation in respect to a memory unit which may not be related to a background health check. A typical foreground operation may be a "read operation" because such an operation may be triggered and executed immediately by a related memory system. Read operations may happen on demand, whereas background operations—such as health checks of a NAND flash memory—may typically be executed at predetermined points in time or may be triggered by controller internal events without the purpose to actively retrieve data for further usage.

The term 'status of the memory page' may denote the recent history of a group of memory cells, e.g., a memory page, and what has happened to the memory page. It may have been programmed—i.e., data may have been written to the memory page recently—or, for a longer, e.g., predefined amount of time, the memory page has not been erased and programmed and only read operations have been performed to the respective memory page. In the latter case, the characteristics of the memory cells relating to the memory page may show effects of a page in retention mode (no program process happened recently). Skilled people will know that the kind of 'read threshold voltage shift value' may depend on its recent history. The status—in particular, the recent historical status, or the status in time—of the memory page may not be intermixed with the logical status of a cell, e.g. "0", or "1".

The term 'NAND flash memory' may denote—in contrast to a NOR flash memory—an electronic (solid-state) non-volatile computer storage medium that can be electrically erased and reprogrammed. NAND flash also uses floating-gate transistors, and they are connected in a way that resembles a NAND gate: several transistors may be connected in series, and the bit line is pulled low only if all the word lines are pulled high (above the transistors' $V_T$). These groups are then connected via some additional transistors to a NOR-style bit line array in the same way that single transistors are linked in NOR flash memory systems. Compared to NOR flash, replacing single transistors with serial-linked groups may add an extra level of addressing. Whereas NOR flash might address memory by page then word, NAND flash might address it by page, word and bit. Their additional prefix '3D' (three-dimensional) may denote the fact that the individual memory cells are oriented vertically instead of horizontally/planar in a wafer/substrate. This may enable a higher density of memory cells.

To read data, first the desired group is selected (in the same way that a single transistor is selected from a NOR array). Next, most of the word lines are pulled up above the $V_T$ of a programmed bit while one of them is pulled up to just over the $V_T$ of an erased bit. The series group will conduct (and pull the bit line low) if the selected bit has not been programmed.

The term 'memory page' may denote a group of memory cells that may be addressed as one group in case of 3D NAND memory in the sense of the above paragraph.

The term 'memory cell' may denote here an electronic circuitry—basically a floating-gate transistor—being able to store one or more bits. Experts differentiate between single level cells (SLC) and multiple level cells (MLC) which may suggest that more than one bit per cell is storable. In practice, the term MLC may very often be used for memory flash cells adapted for storing two bits per cell—i.e., per floating gate transistor. Other forms are TLC (three level cell) and QLC (quad level cell).

The use of a singular term, such as, but not limited to, 'a' is not intended as limiting of the number of items. In particular, the term 'read threshold voltage shift value' is not limited to a single value. For example, in a NAND flash memory using TLC, a shared physical page includes a lower, upper, and extra page. The number of read threshold voltage shift values may correspond to a single value for lower, two values for upper, and four values for extra pages. It should be understood that depending on the page type, one or more read threshold voltage shift values have to be optimized, where all values can be optimized at the same time or independent from each other without departing from the spirit and scope of the invention.

The term 'PCM based memory cells' may denote—in contrast to NAND flash memory cells—a usage of the unique behavior of chalcogenide glass. Different crystalline and amorphous phases of PCM cells may relate to different resistance values of a PCM cell. The different resistance values may relate to a plurality of stored bits in a PCM cell.

The term 'programmed' may denote the act of writing data to the non-volatile memory cells. These may typically be written or programmed as a complete block, e.g., a memory page of a NAND flash memory. A writing of single bits to individual cells is not possible for, e.g., NAND flash memory cells.

The term 'retention mode' may denote that during a predefined time no erase, program or write process has happened to the previously programmed respective memory page or block.

The term 'raw bit error rate' (RBER) may denote the number of bit read errors in non-volatile memory cells per defined number of cells. The bit errors may be correctable by an ECC algorithm or circuitry or not. However, the RBER may relate to the number of uncorrected bit errors.

The term 'lower page', the term 'upper page' and the term 'extra page' may relate to TLC NAND flash memory. The terms may denote the different shared pages that are associated with the same word-line and which are represented with different levels in the cells being able to store more than 1 bit per cell. Thus, word lines comprising triple level cells (TLCs) may have stored data in an upper page, a lower page, and an extra page. The term 'top page' may relate to QLC NAND flash memory. A memory page comprising quad level cells (QLCs) may have stored data in an upper page, a lower page, an extra page and, a top page.

The term 'step size' may relate an increase or decrease in the read threshold voltage shift value during an iteration and/or a single loop in the foreground or active operation mode, e.g., a current read operation.

The term 'alternating fashion' may denote that a left shifting and a right shifting of the read threshold voltage shift value may happen one after the other. Alternatively, and in contrast to the alternating fashion, all right shifts and all left shifts may happen group-wise, i.e., all left shifts first and then all right shifts, or vice versa.

A skilled person will understand that a left shift may be equivalent to reducing the read threshold voltage value (i.e., move more to the left in an x-y-diagram having the VTH on the x-axis and e.g., the RBER on the y-axis)). Consequently, a skilled person will also understand that a right shift may be equivalent to increasing the read threshold voltage value in the same x-y-diagram.

The term 'threshold delta value' may denote a voltage value, and in particular its change over time, required to identify a stored bit in a cell of a NAND flash memory. The threshold delta value may be added to a base read threshold voltage value. The term delta may also be denoted as offset.

The proposed method for optimizing a read threshold voltage shift value for non-volatile memory units organized as memory pages may offer multiple advantages and technical effects:

Background health checks for the memory cells of memory pages may be eliminated altogether. However, this is not to say that the background health checks are obsolete. They may be useful for other purposes, and in particular for reducing the average read latency. On the other side, if a background calibration process has not yet run on a particular page of the block to be read, the background calibration process happened so far in the past that retention effects dominate the behavior of the memory cells causing the current TVS values to be potentially unsuitable.

Performing the TVS adjustment as part of a foreground process may be seen as an "in vivo" (live) health check during the course of a read operation, if the ECC algorithm cannot correct. The method searches for a different TVS value for which the ECC algorithm succeeds, before the read operation finishes. It may also enable a longer lifespan of memory pages.

The proposed method searches across all the possible TVS values supported by the hardware and is therefore guaranteed to detect a valid and working TVS shift if that exists. The scheme employs a variable resolution of TVS shifts, as well as, a possibility to bias the direction of the search based on side information (e.g., based on previous operations and Flash block status) to minimize execution latency.

The management of TVS values may become more dynamic and a shift to the left (lower voltage values) and/or to the right (higher voltage values) can also be accommodated in a much more dynamic fashion; i.e., during every read operation of a specific memory page.

Further, if pages are calibrated in groups, the optimal TVS value determined is being used for all pages in the group. However, there may still be differences between the pages in the same group and one particular page in the group may not be correctable with the TVS values of that group. In such a situation, it is beneficial to revert to the proposed methods being disclosed herein.

In the following, additional embodiments—also applicable for the system—will be presented:

According to one embodiment of the method, the non-volatile memory units may be selected out of the group comprising, e.g., NAND flash memory cells, NOR flash memory cells, PCM based memory cells, and/or MRAM based memory cells. Thus, a read optimized process and an optimized threshold voltage shifting value adjustment for different types of non-volatile memory cells may be provided.

According to one advantageous embodiment of the method, the determining the status of the memory page—in particular with respect to its raw bit error rate behavior—may be selected out of the group comprising (a) determining whether the memory page was programmed—i.e., written—within a predefined period of time prior to the read operation, (b) determining whether the memory page was in retention mode within a predefined period of time prior to the read operation, (c) determining whether the memory page has seen a high number of reads since being programmed, (d) determining whether the memory page's raw bit error rate distribution with respect to the threshold voltage shift value is shifting to a higher or lower value based on transient effects, and (e) determining whether the memory page's raw bit error rate distribution with respect to the threshold voltage shift value is shifting to a higher or lower value based on neighboring memory page interference or neighboring memory block interference. Thus, alternative statuses of the memory page may be determined prior to the adjustment process of the threshold value adjustment. Additionally, statuses of the memory may also be determined.

According to one possible embodiment of the method, the adjusting the current threshold voltage shift value may also comprise: upon determining that the memory page was programmed, adjusting the current threshold voltage shift value to a higher value. Thus, the recent past of the memory page may influence the adjustment process. Because a recently programmed page may hold more carriers in the floating gate, the threshold voltage value to be applied may have a higher value. Similarly, more carriers in the floating gate may also have been resulted from a large number of reads in the block.

According to another possible embodiment of the method, the adjusting the current threshold voltage shift value may also comprise: upon determining that the memory page was in retention mode, adjusting the current threshold voltage shift value to a lower value. In retention mode, the floating gate may have lost some of its charge carriers due to tunneling effects. Consequently, the threshold voltage value may be adjusted to lower values.

According to one further embodiment of the method, the adjusting the current threshold voltage shift value may also comprise: upon determining that if the memory page's raw bit error rate distribution with respect to the threshold voltage shift value is shifting to a higher or lower value, adjusting the current threshold voltage shift value to a higher or lower value, respectively. This may be seen as a consequence of the previously described optional embodiments.

According to one additional embodiment of the method, the determining the status—in particular in time or, with respect to cell or block interferences or with respect to transient effects, etc.—of the memory page may also comprise determining the status of a lower page, an upper page an extra page and a tops page (in case of QLCs) of the memory page. This may apply for memory pages implemented as three level cells, which may be the most common ones today. For other cell types (e.g., MLC, QLC) also other page statuses may be determined and the result may be used as indication for the shift of an applicable threshold voltage value.

According to one embodiment of the method, the stop condition may be met if the current threshold voltage shift value exceeds a predefined maximum deviation. Thus, threshold voltage values outside specifications of the memory cells may easily be avoided as part of the read process. This way, the threshold voltage value adjustment may find its natural limit and the read process may return an error indicating that the memory page has not be read successfully.

According to another embodiment of the method, the stop condition may be met if the current threshold voltage shift to lower values exceeds a predefined maximum deviation to the lower values, and/or the current voltage shift value to higher values exceeds a predefined maximum deviation to higher values, respectively. This way, it may be guaranteed that the loop process comes to an end in case the alternating of the adjustment of the threshold voltage values may be applied.

According to one optional embodiment of the method, the adjusting the current threshold voltage shift value may also comprise adjusting a step size for adjusting the current threshold voltage shift value for every iteration of the repeating. This may be performed if the read process may not pass the ECC check. Smaller, more fine-tuned steps may be used to find an optimum or near optimum threshold voltage value.

According to this permissive embodiment, the method may comprise, depending on the status of the memory page to be read, that the adjusting the current threshold voltage shift value may comprise adjusting the current threshold voltage shift value to possible higher values before adjusting the current threshold voltage shift value to possible lower values before or vice versa. This embodiment may basically be detailed in FIGS. 6a, 6b below. It may be in contrast to the implementation detailed in FIG. 5a, 5b.

According to this alternate permissive embodiment, the method may comprise, depending on the status, the adjusting the current threshold voltage shift value may comprise adjusting the current threshold voltage shift value to possible higher values and to lower values in an alternating fashion. Thus, a higher threshold voltage value may be tried and then a lower than the current threshold voltage value. Both last described permissive embodiments have their individual advantages. In one embodiment, the algorithm implemented may switch between the two permissive embodiments based upon previous successful read operations.

In the following, a detailed description of the figures will be given. All instructions in the figures are schematic. Firstly, a block diagram of an embodiment of the inventive method for optimizing a read threshold voltage shift value for non-volatile memory units organized as memory pages is given. Afterwards, further embodiments, as well as embodiments of the system for optimizing a read threshold voltage shift value for non-volatile memory units organized as memory pages, will be described.

FIG. 1 shows a block diagram of an embodiment of the method 100 for optimizing a read threshold voltage shift value—i.e., a derived read threshold voltage value—for non-volatile memory units organized as memory pages. Each memory page comprises a plurality of memory cells and an ECC check process is present for the active read process. The method 100 comprises, as part of a read operation, determining, 102, a status of the memory page to be read. This status may, e.g., include a determination whether the page was recently written, being retention mode, or other conditions.

The method 100 may comprise reading, 104, a page of memory cells with a current threshold voltage shift value. Additionally, the method 100 comprises upon determining that a read memory page command passed an error correction code check, returning, 106, corrected data read from the memory page as output of the read operation.

Furthermore, the method 100 comprises, a loop process that is repeated, 108, until a stop condition is met; namely, upon determining, 110, that the read memory page did not pass the error correction code check, adjusting, 112, the current threshold voltage shift value based on the status of the memory page to be read Before discussing specific embodiments of the here proposed concept and for a general understanding in which context the here proposed concept may be implemented advantageously, reference is now made to FIG. 2, in which a block diagram of an exemplary flash memory module 200 is depicted, which may be used to implement the here proposed concept. The flash memory module 200 comprises one or more memory dies, each implementing at least one memory array 202, e.g., formed of 3-D NAND flash memory cells. As indicated in FIG. 2, the memory cells within the memory array 202 are physically arranged in multiple blocks 204, in turn comprising multiple physical pages 206.

As known to those skilled in the art, NAND flash memory, such as that employed in memory array 202, has to be erased prior to being programmed. Further, NAND flash memory can be (but is not required to be) constrained by its architecture, such that the smallest granule of storage that can be erased is a block 204 and the smallest granule of storage that can be accessed by a read or write operation is fixed to the size of a single physical page 206 (as already explained above in another context). It should be appreciated in this regard that the LBAs (logical block address) provided by a host device correspond to logical pages within a logical address space, wherein each logical page typically has a size of e.g., 4 kB (kilobytes). Physical pages 206, in contrast, typically have a larger size, e.g., 16 kB, and can thus correspond to multiple logical pages.

The flash memory module 200 further comprises a row decoder 210, through which word lines of the memory array 202 may be addressed (address line 220) and the column decoder 212, through which bit lines of the memory array 202 may be addressed (address line 218). In addition, the flash memory module 200 comprises a read/write circuit 214 that enables the memory cells of a physical page 206 to be programmed or read in parallel. The flash controller circuitry at 200 additionally comprises a control circuit 205 that provides chip-level control of operations (commands 222, 224) of the memory array 202, including read and write accesses made to physical memory pages 206, erasure of data in blocks 204, and the amplitude, duration and plurality of related voltages applied to the memory array 202. The data input/output to/from the flash memory module 200 may flow along the double arrow 224. It may be helpful to keep this general architecture in mind when referring to the following figures.

FIG. 3 shows a block diagram of a flash card 300 used in a data storage system (not shown). The here proposed concept—either as a method or as a related controller/system—may be implemented on the level of the flash card 300.

The flash card 300 includes a gateway 302 that serves as an interface between the flash card 300 and RAID controllers or host bus adapters (HBA) of the data storage system (not shown). The gateway 302 is coupled to a general-purpose processor (GPP) 304, which can be configured (e.g., by program code) to perform pre-processing on operations received by the gateway 302 and/or to schedule servicing of the operations by the flash card 300. The GPP 304 is coupled to a GPP memory 306 (random access memory/DRAM) that can conveniently buffer data created, reference and or modified by GPP 304 in the cause of its processing or data flowing through the gateway 302 destined for one or more of the flash controllers 308.

The gateway 302 is further coupled to one or more multiple flash controllers 308, each of which controls a respective NAND flash memory system 310 which comprises multiple individually addressable NAND flash memory storage devices 312. The flash controllers 308 can be implemented, for example, by an ASIC (application specific integrated circuit) and/or a FPGA (field programmable gate array), and/or a microprocessor, and each flash controller 308 can have an associated flash controller memory 314 (e.g., DRAM). In embodiments in which flash controllers 308 are implemented with an FPGA, the GPP 304 may program and configure the flash controllers 308 during start-up and data of the higher-level data storage system. After start-up, in general, and operation, the flash controllers 308 receive read and write operations from the gateway 302 that requests to read data stored in the NAND flash memory system 310 and/or to store data in the NAND flash memory system 310. The flash controllers 308 service these operations, for example, by accessing the NAND flash memory system 310 to read or write the requested data from or into the NAND flash memory system 310, or by accessing a memory cache (not illustrated) associated with the NAND flash memory system 310.

The flash controllers 308 implement a flash translation layer (FTL) that provides a logical-to-physical address translation to enable access to specific memory locations within the NAND flash memory system 310. In general, an operation received by the flash controller 308 from a host device, such as a higher-level processor system, contains the logical block address (LBA) at which the data is to be accessed (read or written) and, if a write operation, the write data to be stored to the NAND flash memory system 310. The operation may also specify the amount (or size) of the data to be accessed. Other information may also be communicated depending on the protocol and features supported by the data storage system. The flash translation layer translates LBAs received from a RAID controller into physical addresses assigned to corresponding physical locations in the NAND flash memory system 310. The flash controllers 308 may perform address translations and or store mappings between logical and physical addresses in a logical-to-physical translation data structure, such as a logical-to-physical translation table (LPT), which may conveniently be stored in the flash controller memory 314.

FIG. 4 shows a block diagram of another high-level flow chart 400 of an embodiment of the proposed method 100, i.e., a modified read process with in-line support for data correction. The internals of the foreground data correction processes will be described in the subsequent FIGS. 5*a* and 5*b*, as well as, FIGS. 6*a* and 6*b*.

It should be noted that in order to simplify the description, the term TVS value is here used as a synonym for one or more TVS levels that are being applied: depending on the flash device used, there are more than one TVS levels that have to be applied on a page read. For example, lower pages may have one, upper pages may have two, and extra pages may have four threshold levels, and top pages may have eight threshold levels. These threshold levels may be unified and determined in a combined fashion, e.g., TVS1=a*TVS2=b*TVS3, . . . , wherein a, b, . . . are predetermined constant real values, or treated independently from each other without departing from the main idea of the here proposed concept.

FIG. 4 describes the main process of reading a memory page. Either the page is read correctly with a passed ECC check or the page correction process with changing VTH values is started.

At 402, the page read process is started. The page is read, 404 with the current TVS value. Next, it is determined (checked), 406, whether the page content passes the ECC check. In case of "yes", the ECC corrected data are returned, 408, immediately to the calling process. In case of "no", the page correction process is started, 410. The read process is then finished, 412.

In another embodiment, one could evaluate all the left (right), TVS values first, and after that, evaluate the right (left) TVS values. This could lead to a reduction in the total number of reads required for the page correction process. For example, evaluating the TVS values to the left first, could be desirable if the block containing the page is known to be in retention mode. Evaluating the TVS values to the right first could be desirable, e.g., if the block containing the page has been recently programmed or has been read a lot.

FIG. 5*a* and FIG. 5*b* shows a block diagram of a more implementation-near flow chart 500 of an embodiment of the proposed method, in which left and right TVS values are adapted sequentially, i.e., one step to the left and one step to the right which shall be seen as a movement on the x-axis in an x-y-diagram having VTH on the x-axis.

FIGS. 5*a*, and 5*b* describes basically a process iteratively adapting TVS values so that left and right shifted TVS values are evaluated during each iteration. The algorithm reduces latency by attempting coarser TVS increments in the beginning, increasing the granularity and thus latency, only if a valid TVS value is not immediately found.

The page correction process starts at 502. Initially, the maximum page correction iterations named max-iter and the current iteration counter named piter is initialized to this maximum value, 504, as well as, initial values for TVS step, TVS step left stepL TVS step right stepR, left minimum TVS LM, right maximum TVS RM, left edge TVS LE, and right edge TVS RE. Then, 506, it is determined whether the left TVS edge value LE is larger or equal to the value of the left minimum TVS LM. If that is the case—case "yes"—the page is read, 508, with a TVS value LE and is checked whether the page can pass the ECC check, 510. If that is the case, case "yes", ECC corrected data are returned, 526 to the calling process and the page correction process finishes at 528.

In case the condition 506 is not fulfilled, the process continues—case "no" of the determination 510—with a determination whether RE is smaller or equal than RM, 512. The same determination, 512, is also executed after a negative outcome—case "no" of the determination 510. If that is the case—case "yes" of determination 512—the page is read, 514, with a TVS value of RE and it is checked whether the red page passes the ECC check.

The process flow continues now on FIG. 5*b*. The references (a), (b), (c) and (d) of FIG. 5*a* correspond to respective marks on FIG. 5*b*.

After the page read step 514, the process continues with a determination 516 whether the read page has passed the ECC check. If that is the case, case "yes", ECC corrected data are returned, 526 to the calling process and the page correction process finishes at 528.

In case, the determination 516 returns a negative result—case "no"—the counter piter is decremented by a value of, e.g., 1, the left TVS edge is decremented by the step size stepL, and the value RE is increased by the step size stepR, compare reference numeral 518.

Then, a combined determination is performed, 520, whether the value of the page correction iterations is already below or equal to zero, or, whether the left edge LE is smaller than the left minimum TVS value LM and the right edge RE is larger than the right maximum TVS RM. If that is not the case—case "no"—the value of stepL is decreased if the value after the decrement is still greater than zero, and the value of stepR is decreased if the value after the decrement still greater than zero; reference numeral 522. Then, the process returns back to the first of determination 506, whether LE>=LM.

In case of a positive outcome of the determination 520—case "yes"—an error is returned, 524, to the calling process, indicating that the data cannot be read from the memory page.

After returning, 526, the data, or returning, 524 the error message, the page correction process finishes at 528.

FIG. 6*a* and FIG. 6*b* show a block diagram of a flow chart 600 of a more implementation-near alternative implementation of an embodiment of the proposed method, in which left and right TVS values are not adapted sequentially, but in a way that firstly all TVS values in one direction (left or right) are tested and after that, all TVS values in the other direction are tested until a read page passes the ECC check or another stop condition occurs.

Based on the status of the block containing the page, the process evaluates all the left (right) TVS values first, and after that evaluate the right (left) TVS values; if the block is not in a state that justifies such a decision, the alternating method described above (FIGS. 5*a, b*) is employed instead.

In detail: the process starts again at 602. Also, the initialization 604 is performed as already described above. Namely, the following variables are initialized: set piter=max-iter, TVS step, TVS step left stepL TVS step right stepR, left minimum TVS LM, right maximum TVS RM, left edge TVS LE, right edge TVS RE. Then it is determined, 604 whether the block condition indicates a shift of an appropriate TVS value to the left. If that is not the case—case "no"—it is determined, 608, whether the block condition is indicating a shift of an appropriate TVS value to the right. If in this case, it is decided that this is not true—case "no"—a mixed left right loop for an adoption of an appropriate TVS value is performed, 610, according to the process, described in the FIGS. 5a and 5a. After that, the process ends at 612.

If block condition indicates a shift to the right or to the left—cases "yes" of the determinations 606, or 608—the process continues with a reading, 614, 616 of the memory page with a current left edge TVS value LE, or a respective current right edge TVS value RE. After that—please refer now to the current enumeration of the flowchart 600 of FIG. 6b—in those cases it will be determined, 618, 630, whether the read of the memory page passes the ECC check. If that is the case—cases "yes"—ECC corrected data will be returned, 620, to the calling process, and the process ends, 612.

If in the determination 618 or 630, the determination result is negative—cases, "no"—the process variables will be adapted. Piter is set to piter minus 1, LE is reduced by the step size stepL and the step size stepL is also decreased, if it is still larger than zero (compare 622); or—in the other case—piter is set to piter minus 1, RE is increased by the step size stepR and the step size stepR is decreased, if it is still larger than zero (compare 632).

Next, in the left branch of the flowchart of FIG. 6b, it is now determined, 624, whether piter is below or equal to zero, or (LE<LM and RE>RM). If that logical operation results in the value "true"—case "yes"—a message is returned to the calling process that the data cannot be retrieved. After that, the process ends at 612.

If, on the other side, the result of the logical operation of the determination 624 is "false"—case "no"—the process continues with a determination 626 whether the left margin has not been reached: LE>=LM. If that is not the case—case "no"—the process returns (via the path (c)) to the step of reading, 616, the memory page with a TVS value of the adapted value of RE.

If on the other side, the determination 626 results in a positive outcome—case "yes"—the process returns via path (a) back to a reading, 614, of the memory page with a TVS value of the adapted LE value.

If, again on the other side, the logical determination 624 results in a "true" outcome—case "yes"—an error is returned, 628, to the calling process indicating that the data cannot be retrieved. After that, the process ends at 612.

A corresponding flow of actions is performed on the right side branch of FIG. 6b. After the iterative adaptation of the process variables piter, RE and stepR (corresponding to the adaptation described in block 622), also here a logical determination 634 is performed: If piter is below or equal to zero, or (LE<LM and RE>RM). In case of a false outcome—case "no"—it is determined whether the right margin has not been reached: RE<=RM, 636. If that is not the case, 636, —case "no"—the process returns (via the path (d)) to the step of reading, 614, the memory page with a TVS value of the adapted value of LE.

In case of a positive outcome of the last determination 636—case "yes"—the process returns (via the path (f)) back to reading, 616, the memory page with a TVS value of the adapted RE value.

If, on the other side, the logical determination 634 results in a "true" outcome—case "yes"—an error is returned, 638, to the calling process indicating that the data cannot be retrieved. After that, the process ends at 612.

FIG. 7 shows a block diagram of an embodiment of the inventive system 700 for optimizing a read threshold voltage shift value for non-volatile memory units organized as memory pages.

Also here, each memory page comprising a plurality of memory cells in the presence of an error correction code method. The system 700 comprises, used as part of a read operation, a first determination unit 702 adapted for determining a status of the memory page to be read, a reading unit 704 adapted for reading a page of memory cells with a current threshold voltage shift value, and a second determination unit 706 adapted for: upon determining that a read memory page command passed an error correction code check, triggering a returning unit adapted for returning corrected data read from the memory page as output of the read operation.

The second determination unit 706 is also adapted for: upon determining that the read memory page did not pass the error correction code check, triggering an adjustment unit adapted for adjusting the current threshold voltage shift value based on the status of the memory page to be read.

Additionally, the system 700 comprises a loop unit 708 adapted for triggering the reading unit 704, the second determination unit 706 and the adjustment unit until a stop condition is met.

Embodiments of the invention may be implemented together with virtually any type of computer, regardless of the platform being suitable for storing and/or executing program code. FIG. 8 shows, as an example, a computing system 800 suitable for executing program code—potentially together with a related controller—related to the proposed method.

The computing system 800 is only one example of a suitable computer system, and is not intended to suggest any limitation as to the scope of use or functionality of embodiments of the invention described herein, regardless, whether the computer system 800 is capable of being implemented and/or performing any of the functionality set forth hereinabove. In the computer system 800, there are components, which are operational with numerous other general purpose or special purpose computing system environments or configurations. Examples of well-known computing systems, environments, and/or configurations that may be suitable for use with computer system/server 800 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like. Computer system/server 800 may be described in the general context of computer system-executable instructions, such as program modules, being executed by a computer system 800. Generally, program modules may include routines, programs, objects, components, logic, data structures, and so on that perform particular tasks or implement particular abstract data types. Computer system/server 800 may be practiced in distributed cloud computing environments where tasks are performed by remote processing devices that are linked through a communications network. In a distributed cloud computing environment, program modules may be located in both, local and remote computer system storage media, including memory storage devices.

As shown in the figure, computer system/server 800 is shown in the form of a general-purpose computing device. The components of computer system/server 800 may include, but are not limited to, one or more processors or processing units 802, a system memory 804, and a bus 806 that couple various system components including system memory 804 to the processor 802. Bus 806 represents one or more of any of several types of bus structures, including a memory bus or memory controller, a peripheral bus, an accelerated graphics port, and a processor or local bus using any of a variety of bus architectures. By way of example, and not limiting, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus. Computer system/server 800 typically includes a variety of computer system readable media. Such media may be any available media that is accessible by computer system/server 800, and it includes both, volatile and non-volatile media, removable and non-removable media.

The system memory 804 may include computer system readable media in the form of volatile memory, such as random access memory (RAM) 808 and/or cache memory 810. Computer system/server 800 may further include other removable/non-removable, volatile/non-volatile computer system storage media. By way of example only, a storage system 812 may be provided for reading from and writing to a non-removable, non-volatile magnetic media (not shown and typically called a 'hard drive'). Although not shown, a magnetic disk drive for reading from and writing to a removable, non-volatile magnetic disk (e.g., a 'floppy disk'), and an optical disk drive for reading from or writing to a removable, non-volatile optical disk such as a CD-ROM, DVD-ROM or other optical media may be provided. In such instances, each can be connected to bus 806 by one or more data media interfaces. As will be further depicted and described below, memory 804 may include at least one program product having a set (e.g., at least one) of program modules that are configured to carry out the functions of embodiments of the invention.

The program/utility, having a set (at least one) of program modules 816, may be stored in memory 804 by way of example, and not limiting, as well as an operating system, one or more application programs, other program modules, and program data. Each of the operating systems, one or more application programs, other program modules, and program data or some combination thereof, may include an implementation of a networking environment. Program modules 816 generally carry out the functions and/or methodologies of embodiments of the invention, as described herein.

The computer system/server 800 may also communicate with one or more external devices 818 such as a keyboard, a pointing device, a display 820, etc.; one or more devices that enable a user to interact with computer system/server 800; and/or any devices (e.g., network card, modem, etc.) that enable computer system/server 800 to communicate with one or more other computing devices. Such communication can occur via Input/Output (I/O) interfaces 814. Still yet, computer system/server 800 may communicate with one or more networks such as a local area network (LAN), a general wide area network (WAN), and/or a public network (e.g., the Internet) via network adapter 822. As depicted, network adapter 822 may communicate with the other components of computer system/server 800 via bus 806. It should be understood that, although not shown, other hardware and/or software components could be used in conjunction with computer system/server 800. Examples, include, but are not limited to: microcode, device drivers, redundant processing units, external disk drive arrays, RAID systems, tape drives, and data archival storage systems, etc.

Additionally, system 700 or the controller according to FIG. 3 for optimizing a read threshold voltage shift value for non-volatile memory units organized as memory pages may be attached to the bus system 806.

The descriptions of the various embodiments of the present invention have been presented for purposes of illustration, but are not intended to be exhaustive or limited to the embodiments disclosed. Many modifications and variations will be apparent to those of ordinary skills in the art without departing from the scope and spirit of the described embodiments. The terminology used herein was chosen to best explain the principles of the embodiments, the practical application or technical improvement over technologies found in the marketplace, or to enable others of ordinary skills in the art to understand the embodiments disclosed herein.

The present invention may be embodied as a system, a method, and/or a computer program product. The computer program product may include a computer readable storage medium (or media) having computer readable program instructions thereon for causing a processor to carry out aspects of the present invention.

The medium may be an electronic, magnetic, optical, electromagnetic, infrared or a semi-conductor system for a propagation medium. Examples of a computer-readable medium may include a semi-conductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W), DVD and Blu-Ray-Disk.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disk read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object-oriented programming language such as Smalltalk, C++ or the like, and conventional procedural programming languages, such as the "C" programming language or similar programming languages. The computer readable program instructions may execute entirely on the user's computer, partly on the user's computer as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatuses, or another device to cause a series of operational steps to be performed on the computer, other programmable apparatus or other device to produce a computer implemented process, such that the instructions which execute on the computer, other programmable apparatuses, or another device implement the functions/acts specified in the flowchart and/or block diagram block or blocks.

The flowcharts and/or block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or act or carry out combinations of special purpose hardware and computer instructions.

The terminology used herein is for the purpose of describing particular embodiments only and is not intended to limit the invention. As used herein, the singular forms "a", "an" and "the" are intended to include the plural forms as well, unless the context clearly indicates otherwise. It will further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements, as specifically claimed. The description of the present invention has been presented for purposes of illustration and description, but is not intended to be exhaustive or limited to the invention in the form disclosed. Many modifications and variations will be apparent to those of ordinary skills in the art without departing from the scope and spirit of the invention. The embodiments are chosen and described in order to best explain the principles of the invention and the practical application, and to enable others of ordinary skills in the art to understand the invention for various embodiments with various modifications, as are suited to the particular use contemplated.

What is claimed is:

1. A method of optimizing a read threshold voltage shift value for non-volatile memory devices organized as memory pages, each memory page comprising a plurality of memory cells in presence of an error correction code method, said method comprising, as part of a read operation,
   determining a status of said memory page to be read,
   reading a page of memory cells with a current threshold voltage shift value,
   upon determining that a read memory page command passed an error correction code check, returning corrected data read from said memory page as output of said read operation,
   upon determining that said read memory page did not pass said error correction code check, adjusting said current threshold voltage shift value based on said status of said memory page to be read, while said read memory pages continues to not pass said error correction code check, repeating said adjusting said current threshold voltage shift value and said determining that said read memory page passes said error correction code check, returning corrected data read from said memory page as output of said read operation, until a stop condition is met, wherein said determining said status of said memory page includes at least determining whether said memory page's raw bit error rate distribution with respect to said threshold voltage shift value is shifting to a higher or lower value based on transient effects, and wherein said adjusting said current threshold voltage shift value includes at least, responsive to determining that said memory page was programmed, adjusting said current threshold voltage shift value to a higher value, wherein the method searches in a foreground process for a different threshold voltage shift value for which an error correction code algorithm succeeds, before the read operation finishes.

2. The method according to claim 1, wherein said non-volatile memory devices are selected out of the group comprising NAND flash memory cells, NOR flash memory cells, and PCM based memory cells.

3. The method according to claim 1, wherein said determining said status of said memory page is selected out of the group comprising:
determining whether said memory page was programmed within a predefined period of time prior to said read operation,
determining whether said memory page was in retention mode within a predefined period of time prior to said read operation,
determining whether said memory page has seen a high number of reads since being programmed, and
determining whether said memory page's raw bit error rate distribution with respect to said threshold voltage shift value is shifting to a higher or lower value based on neighboring memory block interference.

4. The method according to claim 3, wherein said adjusting said current threshold voltage shift value also comprises:
upon determining that said memory page was in retention mode, adjusting said current threshold voltage shift value to a lower value.

5. The method according to claim 3, wherein said adjusting said current threshold voltage shift value also comprises:
upon determining that if said memory page's raw bit error rate distribution with respect to said threshold voltage shift value is shifting to the higher or lower value, adjusting said current threshold voltage shift value to the higher or lower value, respectively.

6. The method according to claim 1, wherein said determining said status of said memory page also comprises:
determining said status of a lower page, an upper page and an extra page of said memory page.

7. The method according to claim 1, wherein said stop condition is met if said current threshold voltage shift value exceeds a predefined maximum deviation.

8. The method according to claim 1, wherein said stop condition is met if a change in said current threshold voltage shift value exceeds a predefined maximum deviation.

9. The method according to claim 1, wherein said adjusting said current threshold voltage shift value also comprises:
adjusting a step size for adjusting said current threshold voltage shift value for every iteration of said repeating.

10. The method according to claim 1, wherein, depending on said status, said adjusting said current threshold voltage shift value comprises:
adjusting said current threshold voltage shift value to a higher value than the current threshold voltage shift value before adjusting said current threshold voltage shift value to a lower value than the current threshold voltage shift value.

11. The method according to claim 1, wherein, depending on said status, said adjusting said current threshold voltage shift value comprises:
adjusting said current threshold voltage shift value to a higher value than the current threshold voltage shift value and to a lower value than the current threshold voltage shift value in an alternating fashion.

12. A system for optimizing a read threshold voltage shift value for non-volatile memory devices organized as memory pages, each memory page comprising a plurality of memory cells in presence of an error correction code method, said system comprising, used as part of a read operation, a hardware processor configured
for determining a status of said memory page to be read,
the processor further configured for reading a page of memory cells with a current threshold voltage shift value,
the processor further configured for
upon determining that a read memory page command passed an error correction code check, returning corrected data read from said memory page as output of said read operation,
wherein the processor is further configured for
upon determining that said read memory page did not pass said error correction code check, adjusting said current threshold voltage shift value based on said status of said memory page to be read,
the processor further configured for, while said read memory pages continues to not pass said error correction code check, repeating said adjusting said current threshold voltage shift value and said determining that said read memory page passes said error correction code check, returning corrected data read from said memory page as output of said read operation, until a stop condition is met,
wherein said determining said status of said memory page includes at least determining whether said memory page's raw bit error rate distribution with respect to said threshold voltage shift value is shifting to a higher or lower value based on transient effects, and
wherein said adjusting said current threshold voltage shift value includes at least, responsive to determining that said memory page was programmed, adjusting said current threshold voltage shift value to a higher value,
wherein the method searches in a foreground process for a different threshold voltage shift value for which an error correction code algorithm succeeds, before the read operation finishes.

13. The system according to claim 12, wherein said determining said status of said memory page is selected out of the group comprising:
determining whether said memory page was programmed within a predefined period of time prior to said read operation,
determining whether said memory page was in retention mode within a predefined period of time prior to said read operation,
determining whether said memory page has seen a high number of reads since being programmed, and
determining whether said memory page's raw bit error rate distribution with respect to said threshold voltage shift value is shifting to a higher or lower value based on neighboring memory block interference.

14. The system according to claim 13, wherein said adjusting said current threshold voltage shift value also comprises:
upon determining that said memory page was in retention mode, adjusting said current threshold voltage shift value to a lower value.

15. The system according to claim 13, wherein said adjusting said current threshold voltage shift value also comprises:
upon determining that if said memory page's raw bit error rate distribution with respect to said threshold voltage shift value is shifting to a higher or lower value, adjusting said current threshold voltage shift value to the higher or lower value, respectively.

16. The system according to claim 13,
wherein said stop condition is met if said current threshold voltage shift value exceeds a predefined maximum deviation.

17. The system according to claim 13, wherein said adjusting said current threshold voltage shift value also comprises:
adjusting a step size for adjusting said current threshold voltage shift value for every iteration said repeating.

18. The system according to claim 13, wherein, depending on said status, said adjusting said current threshold voltage shift value comprises:
adjusting said current threshold voltage shift value to a higher value than the current threshold voltage shift value and to a lower value than the current threshold voltage shift value in an alternating fashion.

19. A computer program product for optimizing a read threshold voltage shift value for non-volatile memory devices organized as memory pages, each memory page comprising a plurality of memory cells in said presence of an error correction code method, said method comprising, as part of a read operation, said computer program product comprising a computer readable storage medium having program instructions embodied therewith, said program instructions being executable by one or more computing systems or controllers to cause said one or more computing systems to:
determine a status of said memory page to be read,
read a page of memory cells with a current threshold voltage shift value,
upon determining that a read memory page command passed an error correction code check, returning corrected data read from said memory page as output of said read operation,
upon determining that said read memory page did not pass said error correction code check, adjusting said current threshold voltage shift value based on said status of said memory page to be read,
while said read memory pages continues to not pass said error correction code check, repeating said adjusting said current threshold voltage shift value and said determining that said read memory page passes said error correction code check until a stop condition is met,
wherein said one or more computing systems determines said status of said memory page at least by determining whether said memory page's raw bit error rate distribution with respect to said threshold voltage shift value is shifting to a higher or lower value based on transient effects, and
wherein said adjusting said current threshold voltage shift value includes at least, responsive to determining that said memory page was programmed, adjusting said current threshold voltage shift value to a higher value,
wherein said one or more computing systems searches in a foreground process for a different threshold voltage shift value for which an error correction code algorithm succeeds, before the read operation finishes.

* * * * *